(12) United States Patent
Van Empel et al.

(10) Patent No.: US 7,432,513 B2
(45) Date of Patent: Oct. 7, 2008

(54) GAS SHOWER, LITHOGRAPHIC APPARATUS AND USE OF A GAS SHOWER

(75) Inventors: Tjarko Adriaan Rudolf Van Empel, Eindhoven (NL); Ronald Van Der Ham, Maarheeze (NL); Niek Jacobus Johannes Roset, Vlijmen (NL)

(73) Assignee: ASML Netherlands B.V., Veldhoven (NL)

( * ) Notice: Subject to any disclaimer, the term of this patent is extended or adjusted under 35 U.S.C. 154(b) by 346 days.

(21) Appl. No.: 11/255,195

(22) Filed: Oct. 21, 2005

(65) Prior Publication Data
US 2007/0090301 A1  Apr. 26, 2007

(51) Int. Cl.
*G01N 21/01* (2006.01)

(52) U.S. Cl. .............. 250/492.2; 250/492.1; 250/428; 250/432 R; 250/435; 250/438

(58) Field of Classification Search ......... 250/428, 250/492.1, 492.2, 548, 559.01, 432, 435, 250/438
See application file for complete search history.

(56) References Cited

U.S. PATENT DOCUMENTS

| | | | | |
|---|---|---|---|---|
| 5,469,260 A * | 11/1995 | Takagi et al. | ............... | 356/500 |
| 6,415,736 B1 * | 7/2002 | Hao et al. | ............... | 118/723 E |
| 6,522,385 B2 * | 2/2003 | Ahn et al. | ............... | 355/30 |
| 6,616,767 B2 * | 9/2003 | Zhao et al. | ............. | 219/121.52 |
| 7,050,149 B2 * | 5/2006 | Owa et al. | ............... | 355/30 |
| 2001/0052322 A1 * | 12/2001 | Hirayama et al. | ... | 118/723 MW |
| 2002/0130276 A1 * | 9/2002 | Sogard | .................... | 250/492.2 |
| 2005/0083496 A1 * | 4/2005 | Dansberg et al. | ............ | 355/30 |
| 2005/0092249 A1 * | 5/2005 | Kilpela et al. | ............... | 118/715 |
| 2005/0199182 A1 * | 9/2005 | Masuda et al. | ............. | 118/715 |
| 2005/0221618 A1 * | 10/2005 | AmRhein et al. | .......... | 438/710 |
| 2005/0223986 A1 * | 10/2005 | Choi et al. | ............... | 118/715 |
| 2006/0055899 A1 * | 3/2006 | Van Der Net et al. | ........ | 355/30 |
| 2006/0191637 A1 * | 8/2006 | Zajac et al. | ........... | 156/345.34 |

FOREIGN PATENT DOCUMENTS

| | | |
|---|---|---|
| EP | 0 498 499 B1 | 8/1997 |
| EP | 1 536 458 A1 | 6/2005 |
| JP | 2000-036453 | 2/2000 |
| JP | 2000036453 A * | 2/2000 |

* cited by examiner

*Primary Examiner*—Jack I. Berman
*Assistant Examiner*—Michael J Logie
(74) *Attorney, Agent, or Firm*—Pillsbury Winthrop Shaw Pittman LLP

(57) ABSTRACT

A gas shower to condition at least one optical path in an optical apparatus, wherein the gas shower includes a gas distribution chamber having a shower outlet side to supply gas to the optical path, the gas distribution chamber being configured to distribute the gas to the optical path, wherein the gas distribution chamber includes a substantially sharp tapered tip.

66 Claims, 6 Drawing Sheets

GAS SHOWER, LITHOGRAPHIC APPARATUS AND USE OF A GAS SHOWER

BACKGROUND

1. Field

The present invention relates to a gas shower, as well as to a lithographic apparatus and a use of a gas shower.

2. Description of Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The application of gas showers is known from the art. For example, European patent EP 0 498 499 illustrates, in a FIG. 18, part of a lithographic apparatus. The apparatus includes a interferometer system and a space in which respective interferometer beams propagate. A constant, preferably laminar stream of air is passed through this space, to obtain a greater accuracy of the interferometer system. Both the purity and the temperature of the supplied air can be controlled. The air is, for example, of purity class 1 and its temperature is, for example, stable within 0.1° C.

U.S. Pat. No. 6,522,385 B2 discloses a different air shower. This air shower, which is disposed between a wafer stage and a lens, comprises a circular head having an upper frame and a porous member bottom attached to the bottom of the upper frame. The thickness of the air shower head increases radially outwardly from a center hole of the head. The head is being used to shower the wafer stage of a lithographic apparatus to prevent contamination of the wafer stage.

SUMMARY

It is desirable to provide an improved gas shower, for example to condition at least one optical path, or to purge a certain region.

In an embodiment of the invention, there is provided a gas shower to condition at least one optical path in an optical apparatus, wherein the gas shower includes a gas distribution chamber having a shower outlet side to supply gas to the optical path, the gas distribution chamber being configured to distribute the gas to the optical path, wherein the gas distribution chamber includes a substantially sharp tapered tip.

In an embodiment of the invention, there is provided a gas shower to condition or to purge at least one region in an apparatus, wherein the gas shower at least includes a gas distribution chamber, having a shower outlet side comprising a plurality of substantially inclined gas passages to supply gas to the region during use.

In an embodiment of the invention, there is provided a gas shower to condition at least one optical interferometer path in an optical apparatus, wherein the gas shower includes a gas distribution chamber having a shower outlet side to supply gas to the optical path, wherein the gas distribution chamber includes a second side which extends opposite to the shower outlet side, wherein the second side includes a first part which extends substantially parallel to the gas outlet side, and a second part which encloses a sharp angle with the gas outlet side to provide a sharp tapered tip.

Besides, according to an embodiment of the invention, there is provided a gas shower to condition at least one optical path in an optical apparatus, wherein the gas shower includes a gas distribution chamber having a shower outlet side to supply gas to the optical path, wherein the shower outlet side includes a plurality of gas passages, the gas passages being distributed non-uniformly with respect to each other.

In another embodiment, there is provided a lithographic apparatus comprising at least one gas shower according to an embodiment of the invention.

Also, an embodiment of the invention provides the use of a gas shower to condition or purge a region, wherein gas is being supplied via the gas shower to the region.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
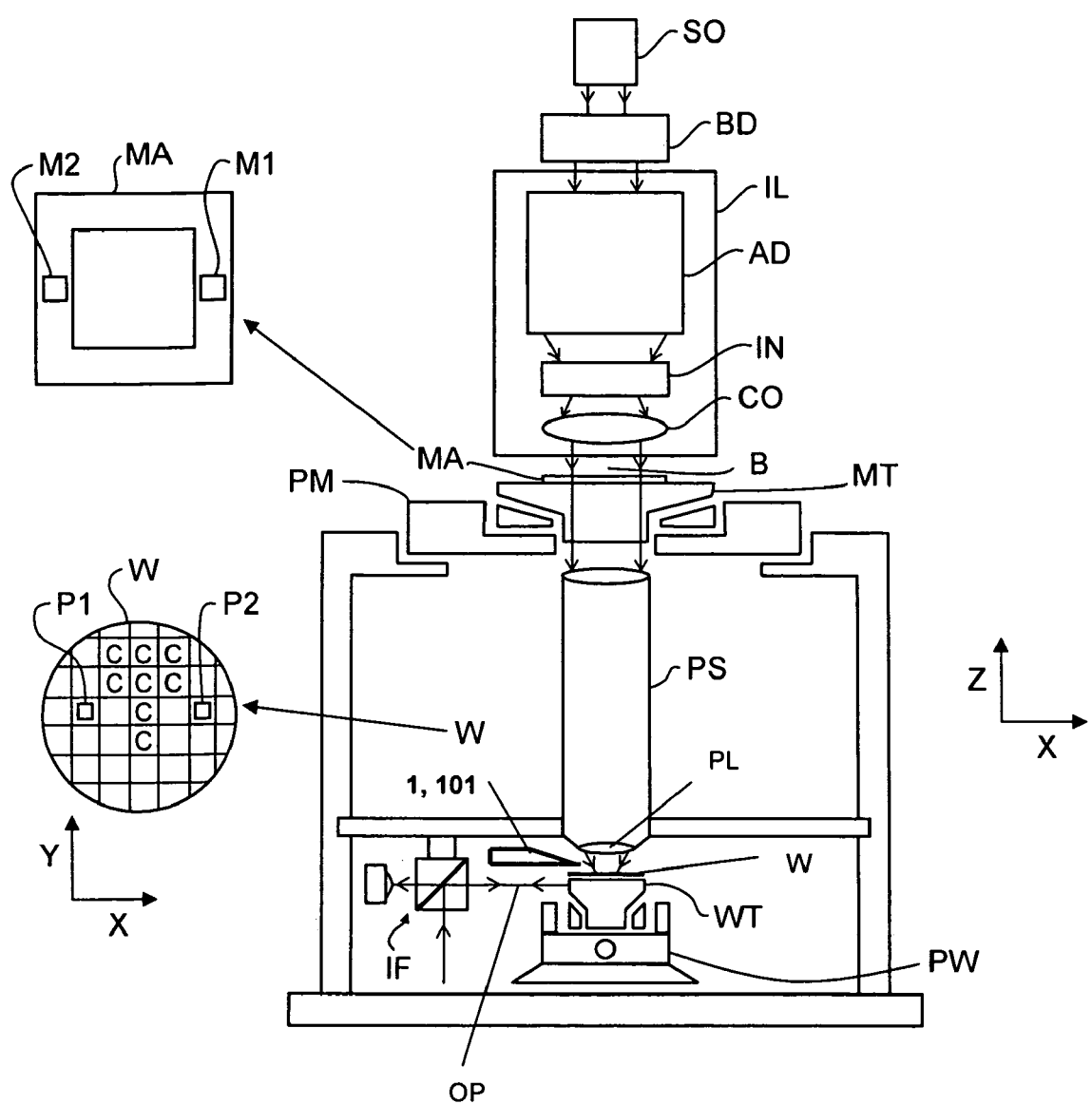
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g., UV radiation or a different type of radiation).

a support structure (e.g., a mask table) MT constructed to support a patterning device (e.g., a mask) MA and connected to a first positioner PM configured to accurately position the patterning device in accordance with certain parameters;

a substrate table (e.g., a wafer table) WT constructed to hold a substrate (e.g., a resist-coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at once (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
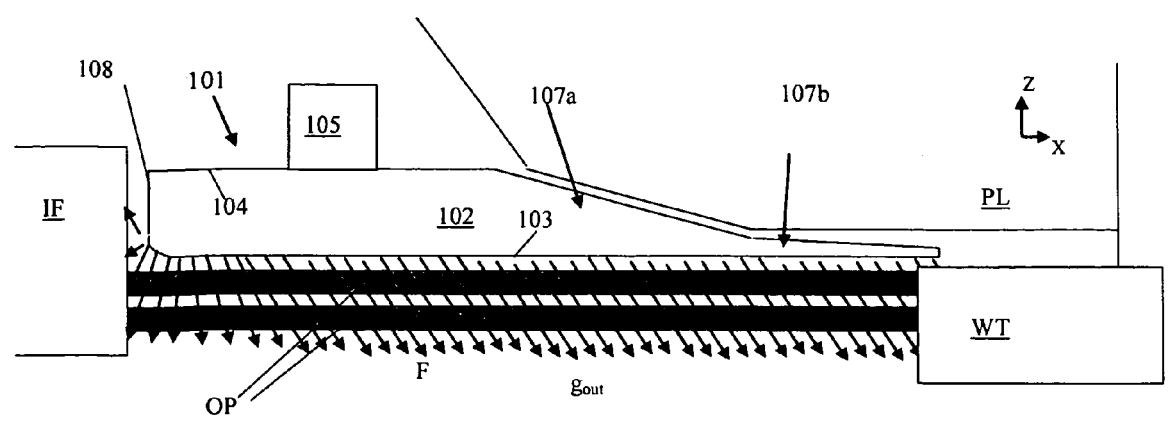
FIG. 5 depicts part of an apparatus having a gas shower according to an embodiment of the invention.

In an embodiment, the apparatus can include at least one interferometer system IF, as well as at least one gas shower 1, 101 which is arranged to supply substantially laminar gas to at least part of an optical path of the interferometer system IF. This is depicted in FIGS. 1, 2 and 5.

In an embodiment of the invention, the gas shower 1, 101 can be used to condition at least one optical path in the lithographic apparatus. The conditioning can involve an optical conditioning, for example to prevent thermal variations in the optical path, particularly to provide an environment having a stable refractive index. Optical paths of interferometer beams are depicted in FIGS. 1, 2, 5 by reference signs OP. Such interferometer beams can run between various parts of the lithographic apparatus. The respective interferometer beams can be used, for example, to accurately position a substrate support WT with respect to a projection lens PL of the projection system PS during use, for example in orthogonal X-, Y- and/or Z-directions (see also FIG. 1). In the embodiments shown in FIGS. 2 and 5, optical paths OP, to be conditioned by a gas shower 1, 101 extend between part of an interferometer system IF on one hand and a substrate support WS on the other hand. The respective gas shower 1, 101, which conditions those optical paths during use, extends between the part of the interferometer system IF on one hand and the substrate support WS and the projection lens PL on the other hand. The gas shower 1, 101 does not extend on a side of the substrate support WS or projection lens PL that is faced away from the part of the interferometer system IF.

Thus, in the present embodiments, the gas shower 1, 101 extends substantially on one lateral side of the projection lens PL.

Figure 2:
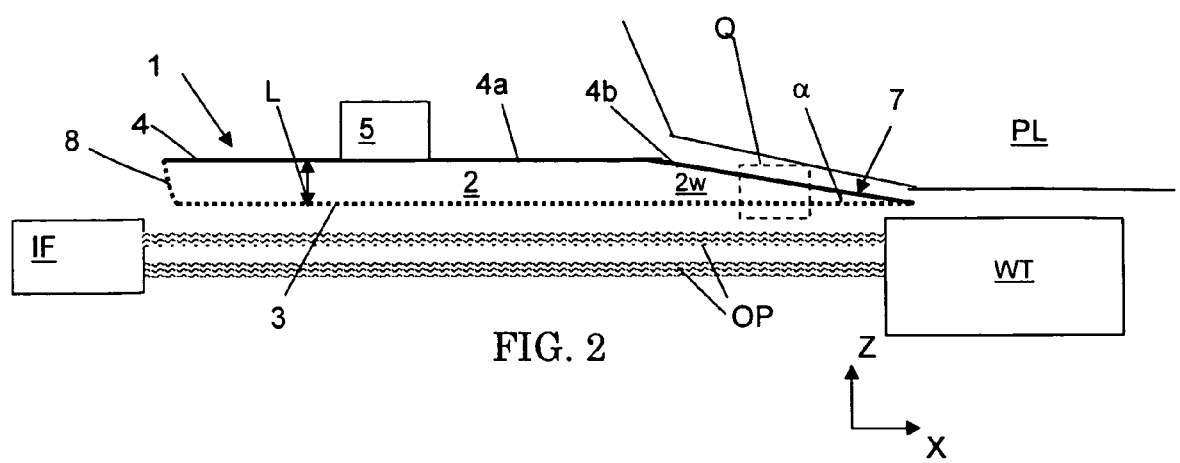
FIG. 2 depicts a longitudinal cross-section of a gas shower of the lithographic apparatus shown in FIG. 1.

The gas shower 1 of the embodiment of FIG. 2 includes a gas distribution chamber 2, which can be, or can include, a suitable gas duct. The length K of the gas distribution chamber 2 (measured in an X direction in the present figures) can be substantially the same as, or a bit smaller than the length of the respective optical paths OP to be conditioned. For example, the length K can be in the range of about 20-50 cm, or a different length. A width M of the gas distribution chamber 2 (measured in a Y-direction in the present figures) can be substantially smaller than the length. The width can be, for example, in the range of about 5-15 cm, or a different width. A height L of the gas distribution chamber 2 (measured in a Z-direction in the present Figures) can be substantially smaller than the width. The height L can be, for example, smaller than about 5 cm, or a different height. For example, the gas distribution chamber 2 can be a relatively long, or elongated, chamber, which can have relatively small dimensions in transversal directions, particularly in a height direction which can be perpendicular to the optical paths OP to be conditioned (see FIGS. 1 and 2).

A first side 3 of the gas distribution chamber 2, in the present embodiment the bottom side 3, is configured to be a gas shower outlet side to supply gas to the optical paths OP. The gas shower 1 also includes a gas inlet 5, to supply gas to the gas distribution chamber 2. Such a gas inlet 5 can be configured in various ways, and can include for example one or more gas supply lines. The gas inlet 5 can be connected to or located at various sides of the gas shower 1, for example to or at a second side 4 which extends opposite the bottom side 3 of the distribution chamber 2, or a different side. During use, various types of gas can be supplied to the gas distribution chamber 2, for example one or more inert gasses, nitrogen, a gas mixture or different gas types. In an embodiment, the gas is air, for example ultra clean air of purity class 1. The temperature of the gas can be relatively stable, for example, stable within about 0.1° C. and particularly stable within about 0.001° C. It is known from the prior art how such a thermally stable gas can be provided.

The gas distribution chamber 2 is configured to distribute the gas with a substantially uniform flow profile to the optical paths OP, as will be explained below. The substantially uniform flow profile can be a flow profile having a substantially uniform gas velocity. For example, the gas flow can be uniform in velocity and in direction of flow. As is shown, in the present embodiment of FIG. 2, the bottom side 3 of the gas shower 1 extends above the optical paths OP to be conditioned. The bottom side 3 of the gas shower 1 can extend substantially parallel to the optical paths OP.

Figure 3:
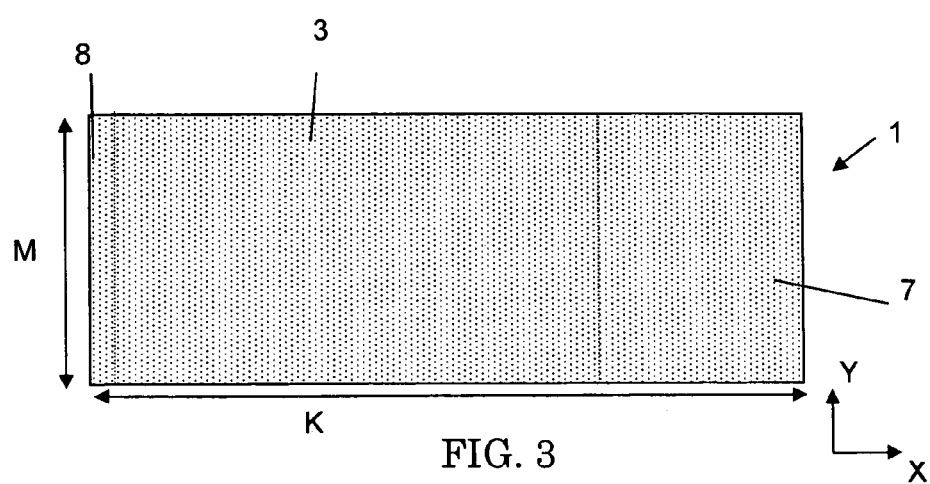
FIG. 3 depicts a bottom view of the gas shower shown in FIG. 2.

Besides, as is depicted in FIG. 3, the bottom side of the gas shower can be substantially rectangular. The gas shower 1 can also be arranged with a differently shaped bottom side 3, depending for example on the optical path or paths OP to be conditioned. The present embodiment of the gas shower 1 does not extend in a circle around a lens PL of the projection system PS, but only laterally with respect to a virtual center axis of the lens PL.

Figure 4:
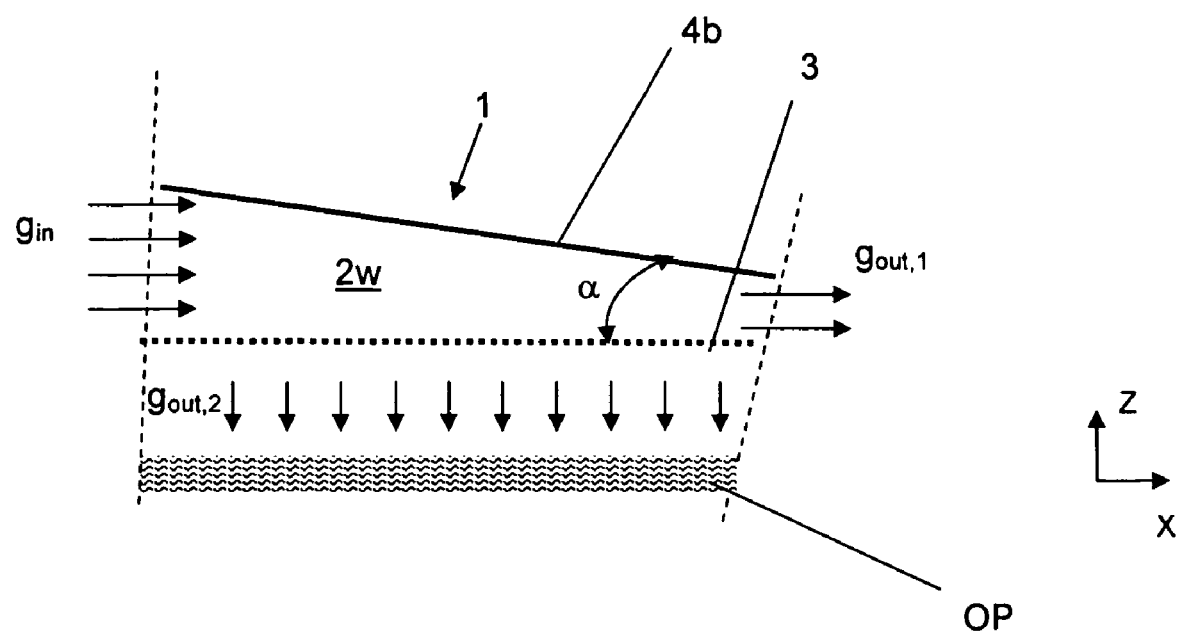
FIG. 4 is a detail Q of FIG. 2.

In the embodiment of FIGS. 2-4, the gas distribution chamber 2 includes a substantially sharp tapered tip 7, when viewed in a side view of in longitudinal cross-section. This tip 7, which can have a sharp taper angle α, forms one end of the gas distribution chamber 2. As an example, the relatively sharp, but long, tip can extend between part PL of a projection system PS and a substrate support WT, even if there is relatively little space available. The sharp tip 7 can provide, or enclose, a wedge shaped part 2*w* of the gas distribution chamber.

In the present embodiment, the amount of taper of the tapered tip 7 does not change. The sharp tip 7 provides, or encloses, a wedge shaped interior part 2*w* of the gas distribution chamber.

In the present embodiment, an opposite end 8 of the gas distribution chamber 2 has a rounded shape, viewed in side view or the longitudinal cross-section (see FIG. 2). The opposite end 8 can also be shaped differently, and can include, for example, a sharp tapered tip as well.

For example, the second side 4 of the gas distribution chamber 2 includes a first part 4*a* which extends substantially parallel to the gas outlet side 3, as well as a second part 4*b* which encloses the sharp angle α with the gas outlet side 3 to provide the sharp tapered tip 7. As an example, the sharp angle a can be smaller than about 20°. Moreover, as an example, the sharp angle α can be smaller than about 10°. In an embodiment, the sharp angle α is about 8°, or smaller. Besides, the sharp angle α can be enclosed by inner surfaces of the respective sides 3, 4*b* of the distribution chamber 2, which inner surfaces are faced towards each other (see also FIG. 4).

In an embodiment of the invention, the gas outlet side 3 can be a substantially flat side, or have a substantially flat outer surface and/or a substantially flat inner surface. Alternatively, the gas outlet side can be provided with certain relief, if desired.

In an embodiment of the invention, each part 4*a*, 4*b* of the second side 4 of the gas distribution chamber can also be a substantially flat side. Alternatively, the gas outlet side 4 can be provided with certain relief or different shape, if desired. Preferably, the second part 4*b* of the second side 4 of the gas distribution chamber 2 has a substantially flat or even inner surface, which extends along a virtual plane that encloses the sharp angle α with the gas outlet side of the gas shower 1. Alternatively, the second part 4*b* of the gas distribution chamber 2 can have a certain relief, a stepped shape, or a different shape.

In the present embodiment, the amount of taper of the tapered tip 7 does not change. Alternatively, a tapered tip could be provided with different sections having different amounts of taper, wherein top sides of the adjoining tapered sections enclose an angle smaller than 180° with each other (such as in the embodiment shown in FIG. 5, see below).

In an embodiment, at least part of the outlet side 3 of the gas distribution chamber can be provided with a mono filament fabric to generate a substantially uniform, laminar gas flow during use. For example, the outlet side can be covered, and/or can be integrally provided, with such a mono filament fabric. Such a fabric can disperse the gas flow in a substantially perpendicular direction (Z in the figures) with respect to the outlet side 3, see FIG. 4, so that gas can be directed substantially perpendicular towards the optical paths OP to be conditioned. Alternatively, the gas outlet side 3 can include a sheet having gas dispersion channels, for example inclined gas passages, for example similar to the embodiment of FIGS. 4-5 (see below). Such a monofilament fabric and/or sheet with gas passages is depicted by broken lines in FIGS. 2 and 4.

For example, the gas outlet side 3 can comprise a thin metal or alloy sheet having a plurality of laser drilled passages. Also, such passages can be manufactured, for example, using etching and/or electric discharge machining. If desired, channels of such a sheet can be inclined channels, to disperse gas under a certain angle with respect to the gas outlet side 3. In an embodiment, the gas outlet side 3 can comprise a thin metal or alloy sheet having a plurality of passages, each of the passages extending obliquely with respect to an outer surface of the metal sheet. Also, a plurality of the passages can extend substantially parallel with respect to each other. For example, a majority of the passages can extend substantially parallel with respect to each other. For example, a plurality of the passages can be directed towards an area which extends laterally from the substantially sharp tapered tip, for example towards a substrate support WT or in an optional direction of movement X of a substrate support WT. This will be explained below concerning the embodiment of FIGS. 5-6.

Besides, part of the gas outlet side 3 can be provided, for example, with monofilament fabric, and part of the gas outlet side 3 can be provided with a sheet having gas passages. For example, part of the gas outlet side 3 extending along the sharp tip 7 of the gas distribution chamber can only be provided with a sheet having passages to distribute gas to the optical path. Also, such a sheet, which can be a metal sheet, a plastic sheet or a different sheet, and monofilament fabric or cloth can be applied together (for example in layers, onto each other) in at least part of the gas outlet side 3. Also, the gas outlet side can be configured differently to feed gas from the gas distribution chamber 2 to an environment thereof.

Furthermore, the distribution chamber end 8 which is opposite to the tip section 7 can be configured to distribute the gas to an environment in various directions, for example to part of an interferometer system IF. To this aim, for example, the opposite end 8 can also be provided with monofilament fabric, with a sheet that includes gas outlet passages, or with a different gas distribution structure.

The gas shower embodiment 1 shown in FIGS. 2-4 is configured to feed gas substantially parallel to the outlet side 3 through the tip section 7, such that the gas is directed towards the top side of the gas distribution chamber in the tip section, as is shown by arrows $g_{in}$ in FIG. 4. For example, this can be achieved with a sufficiently large supply channel 5. For example, the gas supply channel or gas inlet 5 can be arranged to generate a dynamic pressure ½×RHo ×V^2 substantially lower than a pressure drop over the gas outlet side (for example over the outlet fabric 3), for example <10% of the pressure drop over gas outlet side 3. Typically, the supply velocity V is about 5 m/s (circa 15 Pa dynamic pressure) and the pressure drop over gas outlet side 3 is circa 180 Pa. Also, the supply velocity and/or pressure drop can have different values.

During use, in the sharp tip 7 the top side 4 of the gas distribution chamber 2 can uniformly deflect the incoming gas $g_{in}$ towards the outlet side 3 of the tip 7 to disperse the gas from the distribution chamber. Even when the gas velocity in the tip 7 is much higher than 5 m/s, and the dynamic pressure much larger than 10% of the pressure drop over the gas outlet side 3, it has been found, that this configuration provides a relatively uniform dispersion of the gas towards the optical paths OP, wherein the velocity of the outgoing gas $g_{out, 2}$ is substantially the same, viewed over the outlet surface of the tip 7. This also holds for locations that are very close to the outer end of the tip, which end can extend near the substrate support WT. For example, in an embodiment, the gas shower can be arranged to provide a very homogeneous flow at the spot where an edge of a wafer stage or substrate support WT can travel at high velocity during use, depending on the position of the gas shower and whether the wafer stage or substrate support WT is moving during use.

Particularly, FIG. 4 shows a section of the tip 7 of the present embodiment, wherein arrows $g_{in}$ depict gas flowing into that tip section, arrows $g_{out, 1}$ indicate gas flowing out of that tip section towards a downstream tip section, and the arrows $g_{out, 2}$ depict gas flowing out of the respective tip section via the outlet side 3 of the tip 7. For example, in any transversal cross-section of the tip section (i.e., in a YZ plane in FIGS. 1-4), the velocity of gas $g_{in}$ flowing into that section and gas $g_{out,\,1}$ flowing towards a downstream tip section is substantially the same. As a result, there are almost no dynamic pressure variations inside the tip 7, so that a homogeneous pressure is obtained inside the tip 7. This homogeneous pressure can result in a uniform flow (downflow in the FIGS. 2, 4) of the gas $g_{out,\,2}$ flowing out of the tip via the outlet side 3. The homogeneous flow can be made laminar, for example, with the appropriate material (such as a mentioned monofilament fabric), and can also on a slightly larger scale be totally absent of vortices, giving a very good conditioning of the optical path OP. Minute flow variations, which can trigger the start of vortices, causing a mixing of unconditioned air into the critical optical region, can be avoided well by the present embodiment.

The gas shower embodiment 1 shown in FIGS. 2-4 can beneficially be used in case the lithographic apparatus includes a hyper NA (Numerical Aperture) projection lens PL of a projection system PS. For example, the gas shower 1 can be used to condition the path of an interferometer beam to about 0.001° C. stability. The gas shower 1 can be placed in between a projection lens PL and an interferometer "block" IF, for example, above a wafer support level. The gas shower 1 can have an outlet velocity directed downwards, as is shown in FIG. 4, or in another direction. The path OP to be conditioned by the gas shower 1 can have various lengths, for example lengths of over approximately 350 mm in 300 mm wafer lithography scanners, with a maximum length of about 450 mm, of different lengths.

In case the lithographic apparatus includes a so called high-NA projection lens PL, the gas shower 1 according to the embodiment of FIGS. 2-4 can still reach substantially the full path OP of interferometer beams which are directed in an X direction toward the substrate support WT.

For example, during use, the gas shower 1 can generate a uniform laminar down flow (in the Z direction in the figures) of a required velocity, for example, about 1.0 m/s or a different velocity. As is shown in FIG. 2, the gas shower 1 can be extended in a very small (in Z direction) tapered volume between lens bottom and an upper surface of the substrate support (or chuck), particularly by providing the gas shower 1 with the sharp tip 7. By mounting the gas shower 1 accurately in height, the tapered volume can be used efficiently. The tapered shape the air shower end 7 has proven to be very effective. During use, a horizontal supply velocity of gas fed into the air shower tip 7 can be substantially equal over the entire tip 7, for example measured along a transversal Y direction, and can therefore can be very high without disturbing the uniform down flow due to dynamic pressure variations inside the chamber 102. In this way, substantially the full interferometer paths OP of the interferometer beams in lithography systems with very high NA lenses can be conditioned.

Figure 6:
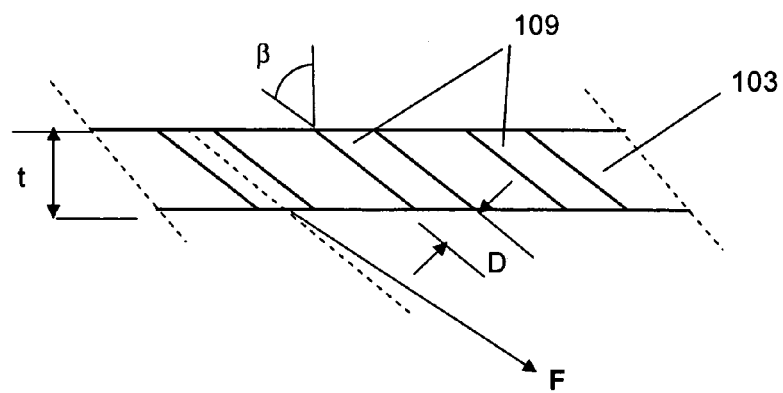
FIG. 6 depicts a cross-section of a detail of the gas shower of the embodiment shown in FIG. 5.

FIGS. 5 and 6 depict a further embodiment of a gas shower 101. This gas shower 101 can be configured and/or dimensioned substantially the same as the gas shower embodiment 1 described above concerning FIGS. 2-4. The gas shower 101 of the embodiment of FIGS. 5 and 6 can also be configured to condition or to purge at least one region in an apparatus, for example a lithography apparatus, with a suitable laminar gas. The gas shower 101 includes a gas distribution chamber 102, having a shower outlet side 103 and an opposite second side 104. For example, the gas shower 101 can be provided with a gas inlet 105, to supply gas to the gas distribution chamber 102.

Also in the present embodiment, the length of the gas distribution chamber 102 (measured in an X direction in the present figures) can be substantially the same as, or a bit larger than the length of respective optical paths to be conditioned, or the region to be purged. For example, the length can be in the range of about 20-50 cm, or a different length. A width of the gas distribution chamber 102 (measured in a Y-direction in the present figures) can be substantially smaller than the length. The width can be, for example, in the range of about 5-15 cm, or a different width. A height of the gas distribution chamber 102 (measured in a Z-direction in the present figures) can be substantially smaller than the width. The height can be, for example, smaller than about 5 cm, or a different height. For example, the gas distribution chamber 102 can be a relatively long, or elongated, chamber, which can have relatively small dimensions in transversal directions, particularly in a height direction which can be perpendicular to optical paths OP to be conditioned, or a region to be purged.

Also, the gas shower 101 can include a tapered tip 107, which can enclose a wedge shaped section of the gas distribution chamber 102. In the present embodiment, the gas distribution chamber includes at least a first tapered section 107a and a second tapered section 107b extending from the first tapered section, wherein the tapered sections have respective gas outlet sides extending in-line with each other. The tapered sectioned have respective top sides extending opposite to the respective outlet sides. The top sides of the tapered sections enclose an angle smaller than 180° with each other. For example, the outermost tapered section 107b can have a relatively sharp top angle, such as in the embodiment shown in FIGS. 2-4.

The embodiment 101 shown in FIGS. 5 and 6 can have various shapes and dimensions. Particularly, the gas outlet side 103 can be substantially rectangular (as in FIG. 3). Besides, in FIG. 5, the embodiment of the gas shower 101 does not extend in a circle around a lens PL of the projection system PS, but only laterally with respect to a center axis of the lens PL. In FIG. 5, the gas shower 101 is located above optical beam paths OP to be conditioned.

In the present embodiment, the outlet side 103 of the gas shower 101 can comprise a plurality of inclined gas passages 109 to supply gas from the distribution chamber 102 to the region, or environment, of the gas shower 101. In a further embodiment, the shower outlet side 103 is provided by a thin sheet 103 having the plurality of inclined passages 109. Each of the passages can extending substantially obliquely through the sheet 103, see FIG. 6.

In an embodiment of the invention, a thickness t of the sheet 103 (measured in a Z direction in the present figures) can be smaller than about 1 mm. For example, the thickness t can be about 0.5 mm or smaller. Also, the sheet can be a metal sheet or an alloy sheet, for example stainless steel. In that case, relatively small gas passages 109 can be manufactured with high accuracy using laser drilling. Gas passages 109 can also be manufactured using different techniques. Also, the sheet 103 can be made of plastic, of one or more different materials. Besides laser drilling, different manufacturing methods can be applied to provide the passages 109, such as etching the passages, manufacturing the passages by electric discharge machining, and/or using different processes like deposition of metal on a mask.

The sheet 103 can also be called a "micro sieve." The sheet 103 can include one or more layers of one or more materials. The sheet 103 can be, or provide, a wall or wall part of the gas distribution chamber 102. In an embodiment of the invention, the sheet 103 can be a substantially flat sheet. Alternatively, the gas outlet side can be provided with certain relief, if desired. Also, part of the sheet 103 can be bended or shaped in a desired fashion towards the opposite side 102 of the gas distribution chamber to provide one end 108 of the gas shower 101 (see FIG. 5).

The gas passages 109 of the sheet 103 can extend in various directions. For example, the passages 109 can enclose angles β with the shower outlet side, the angles being in the range of about 0°-60°. As an example, the angles can be in the range of about 20°-50°, or about 20°-40°. In the present FIGS. 5, 6, the gas passages 109 enclose the angles β with virtual (vertical) YZ planes, which planes extends perpendicularly with respect to the optical paths OP.

Besides, in an embodiment, a plurality of the gas passages 109 extends substantially parallel with respect to each other. In this way, gas can be directed by the gas passages in substantially the same direction. Besides, in the present embodiment, each gas passage 109 extends in a substantially straight direction through the sheet 103. Alternatively, gas passages can be curved, or extend in other directions.

The gas passages 109 can have various diameters or dimensions. A diameter or width D of each of the passages can be, for example, smaller than about 0.2 mm. For example, the diameter or width can be smaller than about 0.1 mm. Good results are obtained when the diameter or width of each of the passages is about 0.08 mm.

Figure 7:
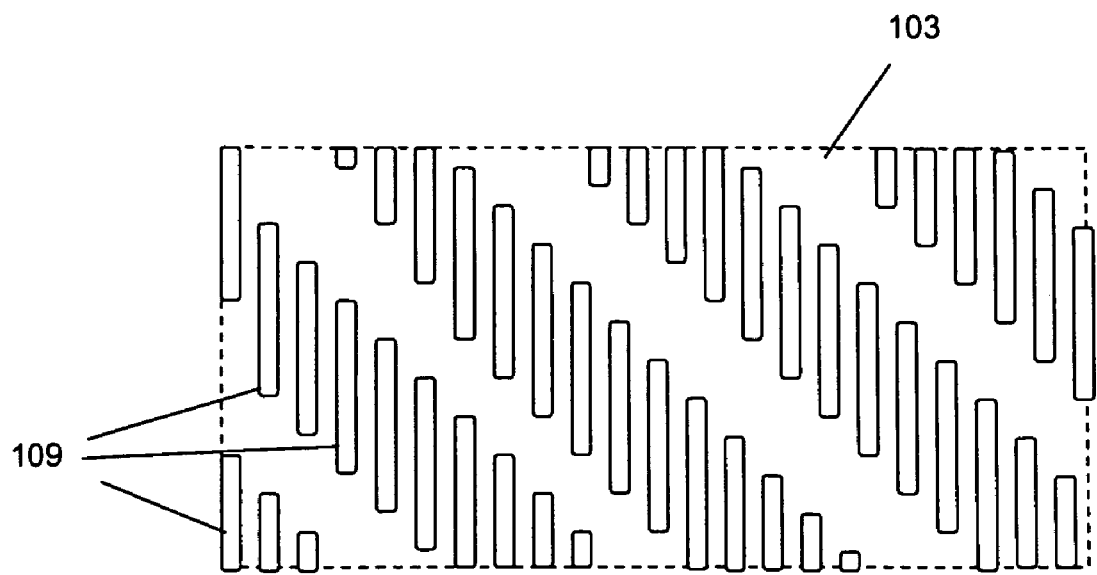
FIG. 7 shows a bottom view of a gas shower as shown in FIG. 5.
Figure 8:
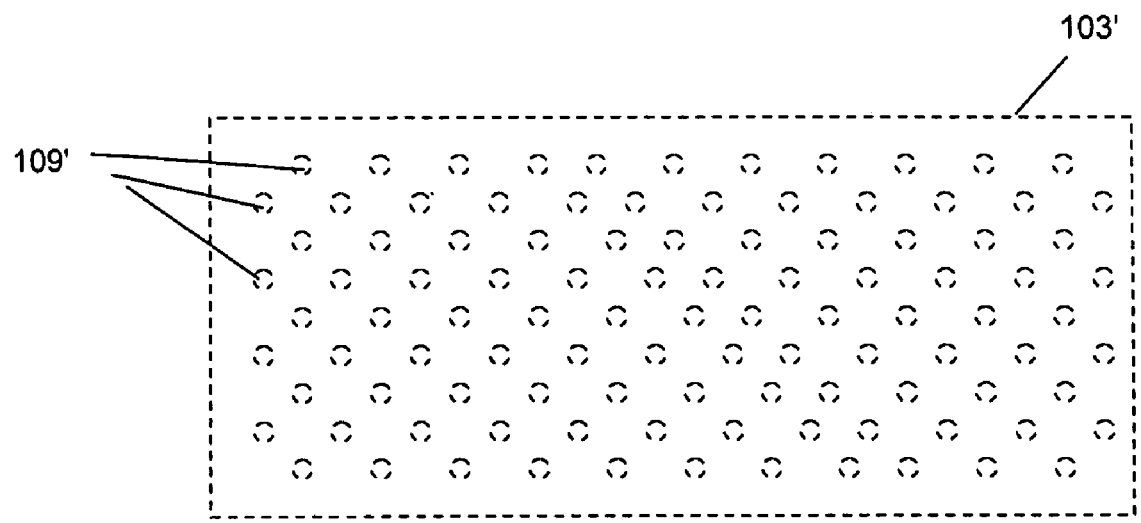
FIG. 8 depicts a bottom view of an alternative embodiment of a gas shower as shown in FIG. 5.

FIGS. 7 and 8 show sections of the two embodiments of the sheet 103, 105 in more detail, in a bottom view. As is shown in FIG. 7, for example, the gas passages 109 can be slits 109. Also, FIG. 8 shows an embodiment wherein the gas passages 109' are through-holes or pores, having substantially circular cross-sections. The gas passages 109 can have various other shapes and/or dimensions, if desired. For example, one sheet 103 can include gas passages of different shapes and/or dimensions.

Preferably, the shower outlet side 103 is provided with a relatively large amount of the gas passages. For example, outlet ends of the passages can cover about 10% to 25% of the shower outlet side 103. Besides, in an embodiment, outlet ends of the passages can cover at least 25% or more of the shower outlet side 103.

Also, the gas passages 109 can be dimensioned such that gas flowing from those passages during use has a Reynolds number Re<10. Besides, during use, a pressure difference between an upstream end and a downstream end of each of the passages 109 can be in the range of about 100-500 Pa. For example, during use, the pressure inside the gas distribution chamber 102 can be about 100 to 400 Pa higher than the pressure downstream of the outlet side 103. The pressure outside the gas distribution chamber 102 can be substantially atmospheric pressure, or a lower or higher pressure. Also, in a further embodiment, during use, a velocity of gas flowing from the gas passages 109 can be at least about 4 m/s.

Also, in the present embodiment, the gas shower 101 can be configured to feed gas substantially parallel to the outlet side 103 towards part of a top side 104 of the gas distribution chamber, for example such that the top side of the gas distribution chamber can deflect incoming gas towards the outlet side 103 to disperse the gas from the distribution chamber via at least some of the passages 109.

During use of the embodiment 101 shown in FIGS. 5-6, gas is supplied to the gas distribution chamber 102 of the gas shower 101. The gas is then being directed via the gas passages 109 of the gas outlet side 103 towards the area to be conditioned. Since the gas passages 109 are inclined, a laminar uniform gas flow can be directed in an beneficial manner, for example to an area which is not located directly below the gas shower 101, but at a laterally removed location. As an example, FIG. 5 shows how a tip part of the gas shower 101 can direct laminar gas towards a substrate support WT, to condition optical paths near the substrate support WT.

In an embodiment, the lithographic apparatus can include a movable substrate support WT. For example, in FIG. 5, the substrate support WT can be movable in an X direction and a reverse direction. In that case, in a further embodiment, the gas shower 101 is preferably arranged to direct the laminar gas at least partly in the same direction as the direction of movement X of the substrate support WT. As is shown in FIG. 5, the inclined gas passages 109 can provide a gas flow, having a flow direction F having a component which is parallel to the X direction, and a component which is perpendicular with respect to the outlet side 103. In this way, the gas shower 101 can prevent or diminish the occurrence of a wake behind the substrate support, when the substrate support WT moves away from, for example, an interferometer block IF.

Besides, it has surprisingly been found, that the flow direction F can have a slightly or substantially higher inclination with respect to the outlet side 103 of the shower 1 compared to the inclination of the gas passages 109. For example, this can occur when the open fraction (=open area/total area) is much smaller than 100%, for example smaller than 25%. In such a case, the gas shower 1 can direct laminar gas flow even better towards a laterally separated area, such as an area near the wafer support WT (see FIG. 5).

Also, the second gas shower embodiment, shown in FIGS. 5 and 6, can beneficially be used in combination with high NA lenses PL. For example, the gas shower 101 can be used to cover certain extreme ranges of a substrate stage, for example to expose outer substrate dies, by clean air or a different type of gas.

The embodiment 101 of FIGS. 5 and 6 can be configured to create a very thin high speed gas shower section, with a flow exiting under an angle, for example towards a lens center and/or other required angles. Preferably, a very thin sheet of metal, for example stainless steel, stainless 316L steel or a different steel, is used, having laser-drill holes under desired angles. The hole dimension can be chosen such, that the Reynolds number is <10, so that the gas flow can be highly laminar. When the open area of the drilled sheet 103 is about 10 to 25%, a velocity and therefore momentum of the gas can be large, so that the gas can sustain the initial exit angle over a relatively long distance. For example, an average velocity of the outgoing gas ($g_{out}$ in FIG. 5, $g_{out,2}$ in FIG. 4) can be about 1 m/s, whereas an exit velocity through the holes of about 4 m/s can be provided. As an example only, a hole diameter of 20 μm can give a Re number of 7. The steel sheet 103 can be laser welded, so that it can be made relatively contamination free and DUV proof. Also, the present embodiment can provide a relatively large pressure drop, which allows a relatively narrow supply duct or gas distribution chamber 102).

A further benefit of a gas shower 101 comprising an manufactured sheet 103 over for example standard mono filament fabric, is the ability to vary the pressure drop over the area. For example, the sheet 103 can be provided with a non-uniform distribution of the open area, for example by providing a gradual changing of hole diameter of the gas passages 109 or open fraction, viewed along the sheet 103. This can be a further way to create a uniform outlet velocity or optimize the outlet velocity distribution ($g_{out}$ in FIG. 5), for example in case of a pressure non-uniformity inside the air shower chamber 102 (for example non uniformity due to high internal velocities or vortices).

Figure 9:
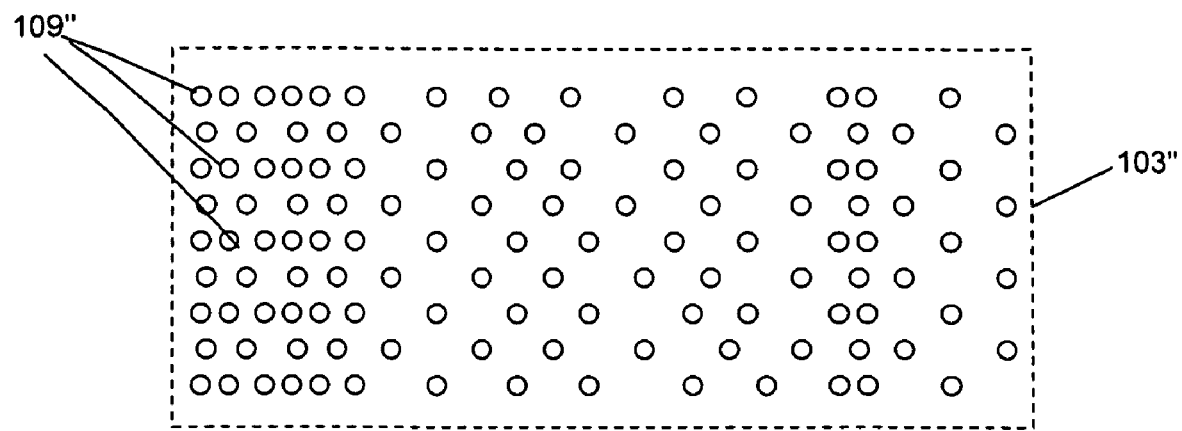
FIG. 9 depicts a bottom view of an other alternative embodiment of a gas shower as shown in FIG. 5.

As an example, an embodiment of a gas shower including a gas distribution sheet 103" having a non-uniform distribution (or non-homogeneous distribution) of gas passages 109"

is depicted in FIG. 9. The gas passages are distributed non-uniformly with respect to each other. For example, in the embodiment of FIG. 9, the pitch of the gas passages 109" (or the distance between the passages 109") varies, viewed along the sheet 103." The embodiment of FIG. 9 can provide a controlled non-uniform flow distribution, or provide a controlled uniform gas flow, depending for example on the uniformity/homogeneousness of gas stream in an upstream gas distribution chamber of the respective gas shower.

The non-uniform distribution of the gas apertures 109", or of the open area of the sheet 103", can provide several benefits. This depends, for example, on the pressure distribution inside the gas distribution chamber of the gas shower. For example, during use, the pressure distribution inside the gas distribution chamber of the gas shower can be non-uniform, wherein a non-uniformity of the open area of the sheet 103" is such that a substantially homogeneous outflow of gas can still be provided by the gas shower. For example, a diameter or width of each of the gas passages 109" can be about 0.02 mm and the pith or diameter of the passages can be varied +/−25%, for example to obtain a non-uniform flow distribution. Also, other dimensions and/or pitch variations can be applied. On the other hand, for example, during use, the pressure distribution inside the gas distribution chamber of the gas shower can be substantially uniform, and a non-uniformity of the open area of the sheet 103" can be to provide a controlled non-uniform or non-homogeneous outflow of gas.

Embodiments of the present invention can provide a high speed gas shower section, for example producing an inclined laminar flow, in a very limited building volume. The gas shower construction can also be very clean and DUV resistant. The gas shower 1, 101 can be applied, for example, to condition optical paths in an optical system. Besides, the gas shower 1, 101 can be used to purge one or more optical elements, for example lenses, mirrors or other apparatus parts.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A gas shower to condition at least one optical path in an optical apparatus, the gas shower comprising a gas distribution chamber having a shower outlet side to supply gas to said optical path, the gas distribution chamber being configured to distribute said gas to said optical path, wherein said gas distribution chamber includes a substantially sharp tapered tip having at least a first tapered section and a second tapered section extending from said first tapered section.

2. A gas shower according to claim 1, wherein the gas distribution chamber includes a second side which extends opposite to said shower outlet side, wherein said second side includes a first part which extends substantially parallel to said gas outlet side, and a second part which encloses a sharp angle with said gas outlet side to provide said sharp tapered tip.

3. A gas shower according to claim 2, wherein said second side is substantially rectangular.

4. A gas shower according to claim 2, wherein the gas shower is configured to feed gas substantially parallel to said outlet side towards the second side of the gas distribution chamber, such that the second side of the gas distribution chamber can deflect incoming gas towards the outlet side to disperse the gas from the distribution chamber.

5. A gas shower according to claim 1, wherein a taper angle of said tip is smaller than about 20°.

6. A gas shower according to claim 1, wherein a taper angle of said tip is smaller than about 10°.

7. A gas shower according to claim 1, wherein the gas shower is arranged to optically condition the path of at least one interferometer beam of a lithographic apparatus during use.

8. A gas shower according to claim 1, wherein at least part of the outlet side of said gas distribution chamber is provided with a mono filament fabric to generate a substantially uniform gas flow during use.

9. A gas shower according to claim 1, wherein at least part of a gas outlet side of the sharp tip of the gas distribution chamber is only provided with a sheet having passages to distribute gas to said optical path.

10. A gas shower according to claim 1, wherein said gas outlet side comprises a thin metal or alloy sheet having a plurality of laser drilled passages, etched passages and/or passages manufactured by electric discharge machining or by deposited metal on a mask.

11. A gas shower according to claim 1, wherein said gas outlet side comprises a thin sheet having a plurality of passages.

12. A gas shower according to claim 11, wherein one of the passages extends obliquely with respect to an outer surface of the sheet.

13. A gas shower according to claim 11, wherein the plurality of said passages extends substantially parallel with respect to each other.

14. A gas shower according to claim 11, wherein the passages are distributed non-uniformly, viewed along the sheet.

15. A gas shower according to claim 11, wherein the sheet is a metal or alloy sheet.

16. A gas shower according to claim 11, wherein the passages are distributed uniformly over the sheet.

17. A gas shower according to claim 11, wherein a plurality of said passages is directed towards an area which extends laterally from said substantially sharp tapered tip.

18. A gas shower according to claim 1, wherein said at least first and second tapered sections have respective gas outlet sides extending in-line with each other, wherein said at least first and second tapered sections have respective second sides extending opposite to said respective outlet sides, wherein the second sides of neighboring tapered sections enclose an angle smaller than 180° with each other.

19. A gas shower according to claim 1, wherein the gas distribution chamber is configured to distribute said gas with a substantially uniform flow profile to said optical path.

20. A lithographic apparatus comprising at least one gas shower according to claim 1.

21. A lithographic apparatus according to claim 20, further including at least one interferometer system, wherein the gas shower is arranged to supply laminar gas to at least part of an optical path of said interferometer system.

22. A lithographic apparatus according to claim 21, including a movable substrate support, wherein said gas shower is arranged to supply laminar gas at least to a region near said substrate support.

23. A lithographic apparatus according to claim 22, the gas shower being arranged to direct said laminar gas at least partly in the same direction as a first direction of movement of the substrate support.

24. A gas shower to condition at least one optical path in an optical apparatus, the gas shower comprising a gas distribution chamber having a shower outlet side to supply gas to said optical path, the gas distribution chamber being configured to distribute said gas to said optical path, wherein said gas distribution chamber includes a substantially sharp tapered tip, wherein said gas outlet side comprises a thin sheet having a plurality of passages and wherein said passages have a variation in diameter.

25. A gas shower to condition at least one optical path in an optical apparatus, the gas shower comprising a gas distribution chamber having a shower outlet side to supply gas to said optical path, the gas distribution chamber being configured to distribute said gas to said optical path, wherein said gas distribution chamber includes a substantially sharp tapered tip, wherein the gas distribution chamber is configured to distribute said gas with a substantially non-uniform flow profile to said optical path.

26. A gas shower to condition or to purge at least one region in an apparatus, the gas shower comprising a gas distribution chamber having a shower outlet side, wherein the shower outlet side includes a plurality of substantially inclined gas passages extending substantially obliquely through the shower outlet side to supply gas to said region during use.

27. A gas shower according to claim 26, wherein the shower outlet side includes at least one sheet having said plurality of substantially inclined passages, each passage extending substantially obliquely through the sheet.

28. A gas shower according to claim 27, wherein a thickness of said sheet is smaller than about 1 mm.

29. A gas shower according to claim 27, wherein a thickness of said sheet is about 0.5 mm or smaller.

30. A gas shower according to claim 27, wherein said sheet is a metal sheet or an alloy sheet, wherein said passages are laser drilled passages, etched passages and/or passages manufactured by electric discharge machining.

31. A gas shower according to claim 27, wherein said sheet is made of deposited metal.

32. A gas shower according to claim 27, wherein said sheet is made of plastic.

33. A gas shower according to claim 26, wherein the gas passages are distributed uniformly with respect to each other.

34. A gas shower according to claim 26, wherein the gas passages are distributed non-uniformly with respect to each other, so that the gas passages can homogeneously supply gas to said region when gas flow or gas pressure is not homogeneously distributed in the gas distribution chamber.

35. A gas shower according to claim 26, wherein the passages enclose angles with said shower outlet side, the angles being in the range of about 0°-60°.

36. A gas shower according to claim 35, wherein said angles are in the range of about 20°-50°.

37. A gas shower according to claim 26, wherein a plurality of said passages extends substantially parallel with respect to each other.

38. A gas shower according to claim 26, wherein a diameter or width of each of said passages is smaller than about 0.2 mm.

39. A gas shower according to claim 26, wherein a diameter or width of each of said passages is smaller than about 0.1 mm.

40. A gas shower according to claim 26, wherein a diameter or width of each of said passages is about 0.02 mm.

41. A gas shower according to claim 26, wherein a diameter or width of each of said passages is about 0.02 mm and the pith or diameter of the passages is varied +/−25% to obtain a non-uniform flow distribution.

42. A gas shower according to claim 26, wherein outlet ends of said passages cover at least 10% or at least 25% of said shower outlet side.

43. A gas shower according to claim 26, wherein said passages are dimensioned such that gas flowing from those passages during use has a Reynolds number Re<10.

44. A gas shower according to claim 26, wherein during use, a pressure difference between an upstream end and a downstream end of each of said passages is in the range of about 100-500 Pa.

45. A gas shower according to claim 26, wherein during use, a velocity of gas flowing from said passages is at least about 4 m/s.

46. A gas shower according claim 26, wherein the gas distribution chamber includes a second side which extends opposite to said shower outlet side, wherein said gas outlet side includes a first part which extends substantially parallel to said second side, and a second part which encloses a sharp angle with said second side to provide a sharp tapered tip.

47. A gas shower according to claim 46, wherein said second side is substantially rectangular.

48. A gas shower according to claim 46, wherein the gas shower is configured to feed gas substantially parallel to said outlet side towards the second side of the gas distribution chamber, such that the second side of the gas distribution chamber can deflect incoming gas towards the outlet side to disperse the gas from the distribution chamber via at least some of said passages.

49. A gas shower according to claim 26, wherein the gas distribution chamber includes at least a first tapered section and a second tapered section extending from said first tapered section, wherein said at least first and second tapered sections have respective gas outlet sides extending in-line with each other, wherein said at least first and second tapered sections have respective second sides extending opposite to said respective outlet sides, wherein the second sides of the tapered sections enclose an angle smaller than 180° with each other.

50. A gas shower to condition at least one optical interferometer path in an optical apparatus, the gas shower comprising a gas distribution chamber having a shower outlet side to supply gas to said optical path, wherein the gas distribution chamber includes a second side which extends opposite to said shower outlet side, wherein said second side includes a first part which extends substantially parallel to said gas outlet side, and a second part which encloses a sharp angle with said gas outlet side to provide a sharp tapered tip, wherein said gas distribution chamber further includes a distribution chamber end arranged opposite said tapered tip and configured to distribute gas in a direction different than the shower outlet side.

51. A gas shower according to claim 50, wherein a length of the gas distribution chamber is substantially the same as, or a bit longer than the length of the respective optical paths to be conditioned.

52. A gas shower according to claim 50, wherein a height of the gas distribution chamber, measured perpendicular to said optical path, is smaller than about 5cm.

53. A gas shower according to claim 50, wherein said second side is substantially rectangular.

54. A gas shower according to claim 50, wherein a taper angle of said tip is smaller than about 20°.

55. A gas shower according to claim 50, wherein a taper angle of said tip is smaller than about 10°.

56. A gas shower to condition at least one optical path in an optical apparatus, the gas shower comprising a gas distribution chamber having a shower outlet side to supply gas to said optical path, wherein the shower outlet side includes a plurality of gas passages, the gas passages being distributed non-uniformly with respect to each other.

57. A gas shower according to claim 56, wherein the shower outlet side includes at least one sheet having the plurality of gas passages.

58. A gas shower according to claim 57, wherein a thickness of said sheet is smaller than about 1 mm.

59. A gas shower according to claim 57, wherein a thickness of said sheet is about 0.5 mm or smaller.

60. A gas shower according to claim 56, wherein the gas passages are distributed non-uniformly with respect to each other, so that the gas passages can homogeneously supply gas to said region when gas flow or gas pressure is not homogeneously distributed in the gas distribution chamber.

61. A gas shower according to claim 56, wherein the gas passages are distributed non-uniformly with respect to each other, so that the gas passages can non-homogeneously supply gas to said region.

62. A gas shower according to claim 56, wherein a plurality of said passages extend substantially parallel with respect to each other.

63. A gas shower according to claim 56, wherein a diameter or width of each of said passages is smaller than about 0.2 mm.

64. A gas shower according to claim 56, wherein a diameter or width of each of said passages is smaller than about 0.1 mm.

65. A gas shower according to claim 56, wherein a diameter or width of each of said passages is about 0.02 mm.

66. A gas shower according to claim 56, wherein a diameter or width of each of said passages is about 0.02 mm and the pith or diameter of the passages is varied +/−25% to obtain a non-uniform flow distribution.

* * * * *